(12) United States Patent
Diroll et al.

(10) Patent No.: US 10,753,545 B1
(45) Date of Patent: Aug. 25, 2020

(54) METHOD FOR DYNAMIC CONTROL OF LIGHT EMISSION FROM PHOSPHORS WITH HEAT EXCITATIONS

(71) Applicant: UCHICAGO ARGONNE, LLC, Chicago, IL (US)

(72) Inventors: Benjamin Diroll, Chicago, IL (US); Peijun Guo, Woodridge, IL (US); Richard D. Schaller, Clarendon Hills, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 9 days.

(21) Appl. No.: 16/274,924

(22) Filed: Feb. 13, 2019

(51) Int. Cl.
  *F21K 2/04* (2006.01)
  *C09K 11/08* (2006.01)
  *F21V 9/32* (2018.01)

(52) U.S. Cl.
  CPC ............ *F21K 2/04* (2013.01); *C09K 11/0811* (2013.01); *C09K 11/0827* (2013.01); *F21V 9/32* (2018.02)

(58) Field of Classification Search
  None
  See application file for complete search history.

(56) References Cited

U.S. PATENT DOCUMENTS

| | | | | |
|---|---|---|---|---|
| 10,414,974 B2 * | 9/2019 | Wang | ...................... | B82Y 10/00 |
| 2018/0265779 A1 * | 9/2018 | Wang | .................. | H01L 51/0048 |
| 2019/0296521 A1 * | 9/2019 | Yun | ........................... | H01S 5/40 |

OTHER PUBLICATIONS

Sercel et al., "Band-Edge Exciton in CdSe and Other II-VI and III-V Compound Semiconductor Nanocrystals—Revisited," *Nano Letters*, (2018).
Nirmal et al., "Observation of the "Dark Exciton" in CdSe Quantum Dots," *Physical Review Letters*, vol. 75, No. 20 (1995).
Hannah et al., "Observation of Size-Dependent Thermalization in CdSe Nanocrystals Using Time-Resolved Photoluminescence Spectroscopy," *Physical Review Letters*, (2011).
Crooker et al., "Multiple temperature regimes of radiative decay in CdSe nanocrystal quantum dots: Intrinsic limits to the dark-exciton lifetime," *Applied Physics Letters*, (2003).

(Continued)

*Primary Examiner* — Thomas R Artman
(74) *Attorney, Agent, or Firm* — Marshall, Gerstein & Borun LLP

(57) ABSTRACT

An optically emissive material and, in particular, materials for use in single photon generation technologies, have multiple excited energy states that have different decay rates and can emit photons with different properties. A primary excitation radiation source is configured to apply primary radiation to an optically emissive material to excite the optically emissive material into a primary excited state. A secondary excitation radiation source is configured to apply secondary radiation to a thermal contribution material to generate thermal energy in the thermal contribution material. The thermal contribution material is physically configured to transfer thermal energy to the optically emissive material and excite the optically emissive material from the primary excited state to a secondary excited state for dynamic control of the emission rate, or emitted photon properties, of the optically emissive material.

20 Claims, 8 Drawing Sheets

(56) References Cited

OTHER PUBLICATIONS

Furis et al., "Time- and Polarization-Resolved Optical Spectroscopy of Colloidal CdSe Nanocrystal Quantum Dots in High Magnetic Fields," *J. Physics Chem. B.*, vol. 109, No. 32 (2005).
Bawendi et al., "Luminescence properties of CdSe quantum crystallites: Resonance between interior and surface localized states," *The Journal of Chemical Physics*, (1992).
Wen et al., "Quantum-confined stark effects in semiconductor quantum dots," *Physical Review B.*, vol. 52, No. 8 (1995).
Eisaman et al., "Invited Review Article: Single-photon sources and detectors," *Review of Scientific Instruments*, (2011).
Senellart et al., "High-performance semiconductor quantum-dot single-photon sources," *Nature Nanotechnology*, vol. 12, (2017).
Empedocles et al., "Photoluminescence Spectroscopy of Single CdSe Nanocrystallite Quantum Dots," *Physical Review Letters*, vol. 77, No. 18 (1996).

\* cited by examiner

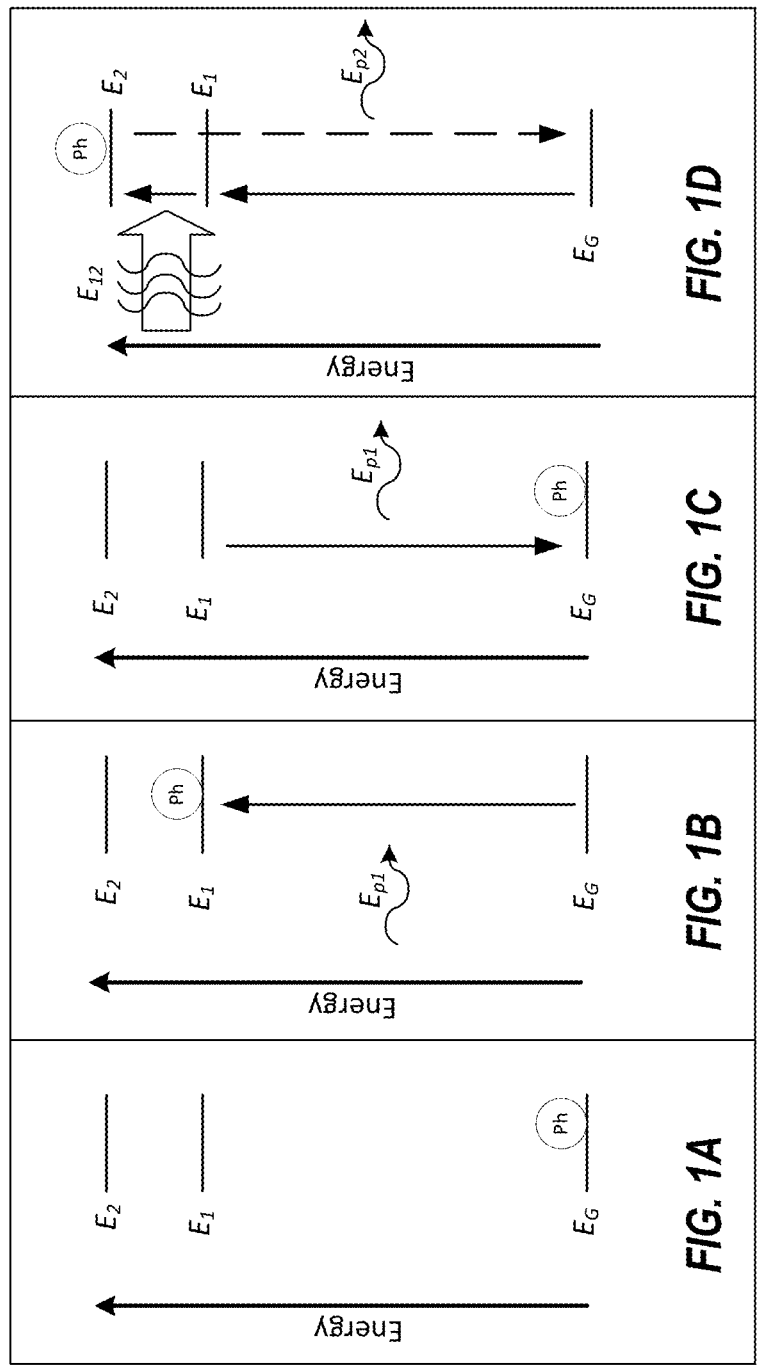

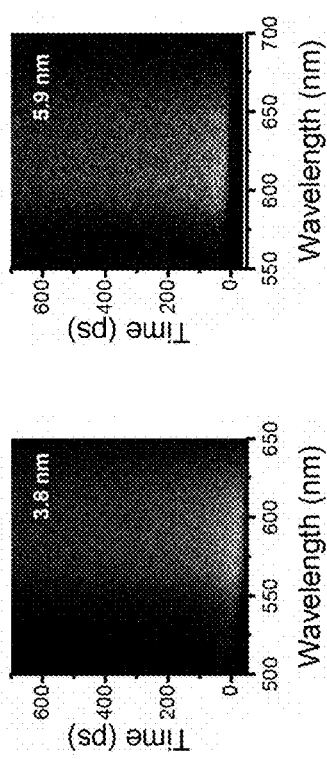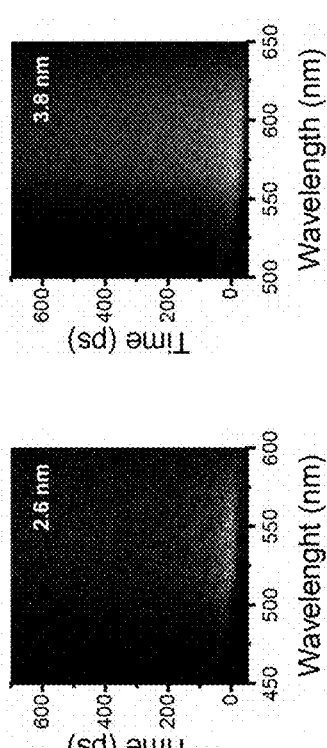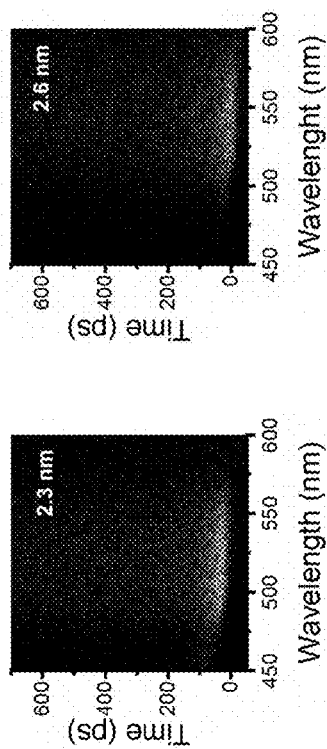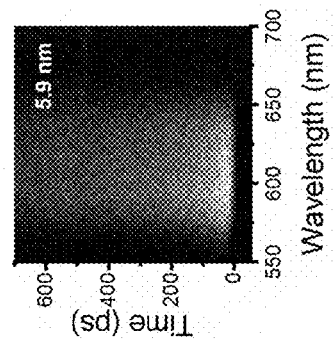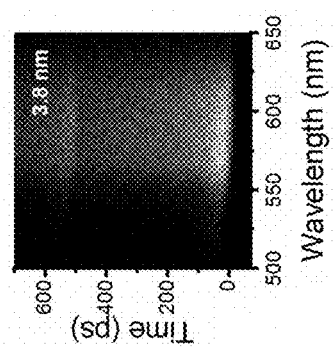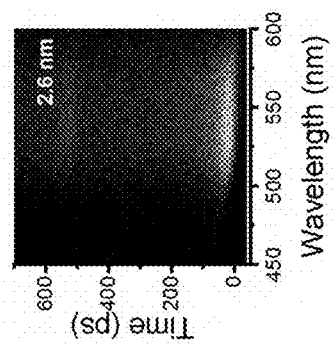
FIG. 3A  FIG. 3B  FIG. 3C  FIG. 3D
FIG. 3E  FIG. 3F  FIG. 3G  FIG. 3H

METHOD FOR DYNAMIC CONTROL OF LIGHT EMISSION FROM PHOSPHORS WITH HEAT EXCITATIONS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to optically emissive materials and, in particular, materials for use in single photon generation technologies.

BACKGROUND

Light emission and the generation of photons is essential to the operation of many current and prospective technologies, in particular those which rely upon single-photon emission processes. Single-photon sources are central for many fields including quantum computing, quantum communications, quantum imaging and detection, and quantum cryptography to name a few. There are currently many forms of single-photon sources such as attenuated laser sources, quantum dots, and entangled photon sources. One type of single-photon source relies on radiative relaxation of an excited phosphor to emit a single photon at a time.

Photon sources dependent on photon emission from a phosphor are fundamentally limited by the rate at which the phosphor emits photons. The duty cycle of a phosphor-based single-photon source depends on the time it takes for a phosphor excitation to be generated and for the relaxation of the phosphor excitation to the ground state via photon emission. Generation of an excited single-photon emitting phosphor depends on the mechanism of excitation, but is typically rapid compared to the time-scale of relaxation and, consequently, photon emission. For example, when optical excitation of a phosphor is employed, excitation generation is approximately instantaneous with a speed controlled by the pulse time of the laser (e.g., tens of femtoseconds). Photon emission from an excited phosphor depends on the electronic structure of the phosphor, which is chiefly determined by the composition and structure of the material. Most phosphors have many energetically close excited electronic states that potentially emit photons with distinct properties, such photon polarization.

Many single-photon sources that rely on de-excitation of a phosphor have slow emission rates due to long relaxation times. For example, a cadmium selenide quantum dot emission time can be as much as 1 microsecond long under single-photon operating conditions. Systems that rely on single-photon sources suffer from slow photon emission rates which may result in low image resolutions and low communication and/or data rate bandwidths among other mal-effects.

SUMMARY OF THE DISCLOSURE

A method for controlling optical emissions of a material including selecting a radiation emitting material, the radiation emitting material having a primary excitation state and a secondary excitation state, the primary and secondary excitation states having different decay rates. The method further including applying a primary radiation to the radiation emitting material to excite the radiation emitting material to the primary excitation state, and applying a secondary radiation to a thermal contribution material physically coupled to the radiation emitting material causing the thermal contribution material to generate thermal energy, and the thermal contribution material being physically configured for thermal energy to flow from the thermal contribution material to the radiation emitting material to promote the excited radiation emitting material to the secondary excitation state.

An optical device includes a radiation emitting material having a primary excitation state and a secondary excitation state, with the primary and secondary excitation states having different decay rates. The optical device further includes a thermal contribution material physically coupled to the radiation emitting material and configured to provide thermal energy to the radiation emitting material, a primary radiation source configured to supply primary radiation to the radiation emitting material to excite the radiation emitting material to the primary excitation state, and a secondary radiation source configured to provide secondary radiation to the thermal contribution material to generate thermal energy in the thermal contribution material.

BRIEF DESCRIPTION OF THE DRAWINGS

FIG. 1A is a diagram illustrating a phosphor at ground state in a three-state quantum system.

FIG. 1B is a diagram illustrating radiation exciting a phosphor from the ground state to a first excited state in a three-state quantum system.

FIG. 1C is a diagram illustrating emission of radiation and relaxation of a phosphor from a first excited state to the ground state in a three-state quantum system.

FIG. 1D is a diagram illustrating heat energy (i.e. thermal energy) exciting a phosphor from a first excited state into a second excited state and the subsequent emission of radiation and relaxation of a phosphor from the second excited state to the ground state in a three-state quantum system.

FIGS. 3A-3D are a series of plots presenting emission data from various sizes of cadmium selenide nanoparticles due to an applied primary radiation.

FIGS. 3E-3H are a series of plots presenting emission data from various sizes of cadmium selenide nanoparticles due to an applied primary radiation and an applied secondary radiation.

DETAILED DESCRIPTION

Figure 2A:
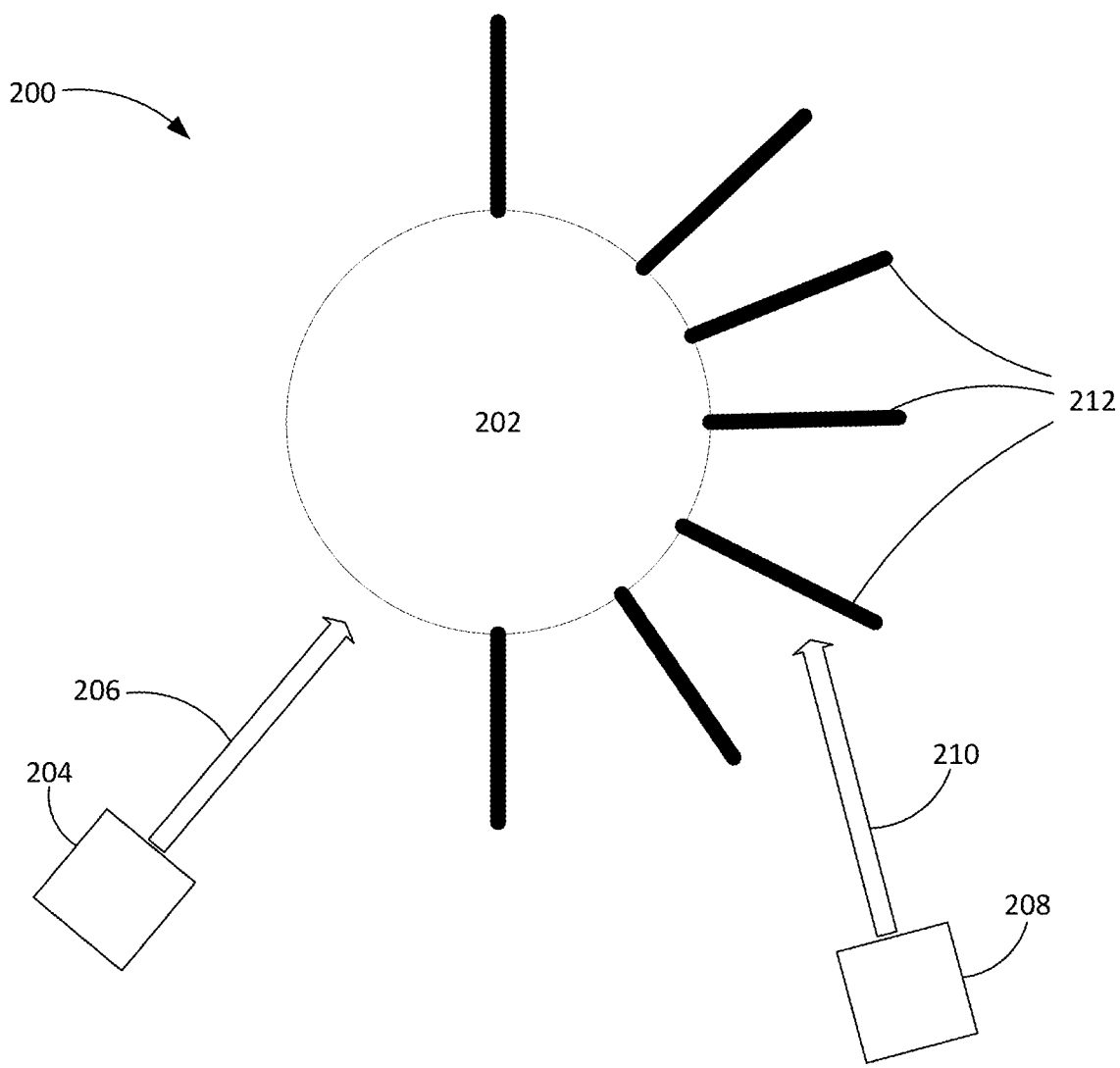
FIG. 2A illustrates an embodiment of an optical emitter having a phosphor, thermal contribution material, primary and secondary radiations, and primary and secondary radiation sources.

One class of single-photon sources relies on the de-excitation of an excited phosphor for the emission of a single photon. Typically, single-photon sources with emissive phosphors are operated at low temperatures to achieve higher emission quantum yields and narrow energy bandwidths of emissions. As used herein, the phrase "low temperature," is used as would be understood by a person of ordinary skill in the art and, specifically, refers to an operational temperature for most single-photon emitting devices and technologies, typically in the range of 1.5 to 5 K. At low temperatures, the low ambient thermal energy of the environment causes excitations to occupy the lowest possible excitation state of the phosphor, which is typically a slow transition state, or a dark state. A dark state or slow transition state can have a relaxation time constant on the order of nanoseconds to microseconds long. Typical single-photon emitters generally have relaxation time constants on the scale of tens of nanoseconds. Dark states involve a quantum mechanically forbidden transition so the time-scale of radiative relaxation from a dark state to the ground state is much longer than the transition time-scale for states that do not have a forbidden transition. Transitions without a forbidden transition that readily relax from the excited state to the ground state and are known as fast transition states or bright states, which can have relaxation time constants on the picosecond time scale. For example, a cadmium selenide quantum dot can have slow transition relaxation time constants, up to microseconds long, while relaxation time constants for emissions from the cadmium selenide bright states range from 10-100 picoseconds, up to five orders of magnitude faster than the slow relaxation time constants.

While the phrases dark state and slow transition state are generally understood in the art as synonyms, and the phrases bright state and fast transition state are likewise understood in the art as synonyms, in order to avoid confusion we will generally use the phrases dark state and bright state in this description when referring to the categories of state transitions based on general transition time scales. That is, dark states have relaxation time constants on the order of nanoseconds to microseconds, while bright states have relaxation time constants on the order of 10-100 picoseconds. In contrast, the phrases "slower transition state" and "faster transition state" (as opposed to "slow transition state" and "fast transition state") will be used in this description to describe relative relaxation time constants, even if both of the slow and fast transition states are bright or both of the slow and fast transition states are dark. A slower transition state is any state that has a longer relaxation time or slower transition than another excited state referred to in the system. One example given above pertains to a cadmium selenide quantum dot with a faster transition state that has relaxation rates up to 100,000 times faster than the relaxation rates of the slower transition state. Other single photon emitters and materials may have faster transition states that are only 2 to 5 times faster than a slower transition state in the system. It should therefore be understood that the faster transition states described herein can be any excited state of a quantum system that exhibits a faster relaxation time constant than the relaxation time constant of another excited state referred to in that quantum system. The methods and devices disclosed herein provide a means for controlling the rate of photon emission and photon polarization through manipulation of an excited phosphor into bright and dark states through thermal excitations.

For embodiments herein, the terms "primary excitation state", and "secondary excitation state" may also be used to describe the energy states of a system. The term "primary excitation state" should be understood to be a non-ground state of a system, the transition to which is stimulated by a primary radiation provided by a primary radiation source, as described below. Similarly, the term "term "secondary excitation state" should be understood to be a non-ground state of a system, the transition to which is induced by thermal excitation caused, directly or indirectly, by secondary radiation provided by a secondary radiation source, as also described below.

In electromagnetics, it is common to distinguish between a frequency, wavelength, energy, and color of electromagnetic radiation. Each of these four characteristics is related to the other three. For example, the wavelength, in nanometers (nm), and frequency, in hertz (Hz), for a specified electromagnetic radiation are inversely proportional to each other. Similarly, the energy, in electron-volts (eV) or joules (J), of electromagnetic radiation is proportional to the frequency of that radiation. Therefore, for a given radiation at a given frequency, there is a corresponding wavelength and energy.

The fourth of the aforementioned characteristics, color, typically represents a group or band of frequencies or wavelengths. For example, the color blue is commonly defined as electromagnetic radiation with a wavelength from 450 nm to 495 nm. This wavelength band also corresponds to frequencies from 606 THz to 668 THz, and energies of 2.5 to 2.75 eV. The color blue, then, is any radiation with one of those wavelengths, or radiation with multiple wavelengths in that band. Therefore, the term color may refer to one specific wavelength, or a band of wavelengths. Some areas of trade in electromagnetics prefer the use of one of the four terms over the others (e.g., color and wavelength are preferred when discussing optical filters, whereas frequency and energy are preferred when optical excitation processes). Therefore, the four terms may be understood to be freely interchangeable in the following discussion of electromagnetic radiation, phosphors, and single-photon sources.

Additionally, as a person of ordinary skill in the art would understand, the terms excited state, excitation state, quantum state, and energy state can be interchangeable when describing the state of a system. Also, the states of a system may also be described as having or existing with a specific energy, E, associated with the state. Therefore, it should be understood that a state may be referred to as an energy state E, or a state with energy E interchangeably. As such, it should be understood that a label E may refer to the energy of a state and/or to the state itself. In photonics, and specifically when considering single photon emission, the terms emission time, relaxation time, relaxation rate, transmission rate, transition time, decay rate, and decay time are also understood to be interchangeable in most cases. In addition, a person of ordinary skill in the art would recognize that the terms excite, promote, or energize are often interchangeable when discussing the transition of a system from one energy level to another, higher, energy level, and similarly the terms de-excite, rest, and recombine may be used interchangeably when discussing the transition of a system from one energy level to another, lower, energy level.

FIGS. 1A-1D are diagrams illustrating systems with three potential energy states. FIGS. 1A-1D are typical representations of energy bands for quantum dots, electrons, or any other particle or ensemble able to occupy various energy bands. FIGS. 1A-1D show a radiation emitting phosphor, Ph, and three energy states: a ground energy state, $E_G$, a primary excited energy state, and a secondary excited energy state. In FIGS. 1A-1D, the primary excited energy state is the lowest excited state or first excited energy state with energy $E_1$, and the secondary excited energy state is a second excited energy state with an energy $E_2$, greater than $E_1$. As illustrated in FIG. 1A, at temperatures on the order of Kelvins, the phosphor typically exists in or occupies the ground energy state. The phosphor remains in the ground energy state until some form of excitation or perturbation changes the state of the phosphor. FIG. 1B illustrates an excitation energy provided by a photon with energy $E_{p1}$. The photon provides energy to the phosphor exciting it to the first excited state. Once in the first excited state, the phosphor may de-excite or relax back down into the ground state and emit a photon with energy $E_{p1}$ as illustrated in FIG. 1C. Alternatively, as illustrated in FIG. 1D, instead of relaxing back into the ground state from the first excited energy state, a second further perturbation with energy $E_{12}$ may be provided to the phosphor to excite the phosphor from the first excited energy state into the second excited energy state. In the illustration of FIG. 1D, and the embodiments herein, thermal energy or heat is provided to the phosphor causing the transition from the first excited energy state to the second excited energy state. Once in the second excited energy state, the phosphor may relax back into the ground energy state emitting a photon with energy $E_{p2}$.

Quantum states of atoms and particles have quantized energies determined by intrinsic properties such as the spin of a particle, and extrinsic factors such as an applied electric field, among other factors. Excited quantum states also have characteristic decay or relaxation times. Typically, the relaxation time of an atom, particle, molecule, or material in a given excited quantum state exhibits an exponential rate of decay. The length of the decay time of a given quantum state depends on the density of states and the temperature of the material among other factors. Some quantum states have forbidden transitions which are transitions forbidden by quantum mechanics, typically due to the required conservation of angular momentum. Such forbidden states are known as slow transition states or dark states because the relaxation time can be long compared to other faster non-forbidden transition states. For example, the intrinsic relaxation time or emission time-scale of cadmium selenide quantum dots can reach 1 microsecond, while faster non-forbidden cadmium selenide quantum states have relaxation times or emission time-scales around 10 to 100 picoseconds at operational temperatures. The faster non-forbidden transition states are also known as fast transition states or bright states.

In some embodiments, the secondary excited state is a bright state, which can be used to induce emissions of photons from a material at faster rates than emissions from the dark state of the single-photon emitter. Referring again to FIGS. 1A-1D, in an embodiment of a method the primary excited state is the first excited state of a phosphor or radiation emitting atom, particle, molecule, or material, $E_1$, which may be a dark transition state, and the secondary excited state is the second excited state of the atom, particle, molecule, or material, $E_2$, which may be a bright transition state. FIG. 1B. illustrates a photon or radiation with an energy $E_{p1}$ exciting the atom, particle, molecule or material from the ground state with energy $E_g$ into the first excited state which is a dark state. As illustrated in FIG. 1D, once the atom, particle, molecule, or material is in the first excited/ dark state, thermal energy with energy $E_{12}$ may be provided to the atom, particle, molecule, or material to excite the atom, particle, molecule, or material into the second excited/ bright state, instead of the atom, particle, molecule, or material relaxing back to the ground state from the first excited state as shown in FIG. 1C. In embodiments that employ thermal energy to excite an atom, particle, molecule, or material from a first dark state to a second bright state, the emission time of the atom, particle, molecule, or material may be controlled and, more specifically, shortened compared to the intrinsic relaxation time of the dark first excited state. The duty cycle or output rate of single photon emission sources may be increased considerably through a second excitation from a first dark state to a second bright state. At sufficiently low operational temperatures, on the order of 1 to 5 K, the thermal occupation of the excited state manifold is typically exclusively in the lowest or first excited energy state, which is often a dark state for direct bandgap materials which are considered candidate phosphors for single-photon emission.

In contrast to the embodiment of the previous paragraph, in other embodiments, the secondary excited state may be a dark state that may enable the ability to slow down or suppress photon emissions from a single-photon emitter. In reference again to FIGS. 1A-1D, in an alternative embodiment of a method, the primary excited state is the first excited state of a phosphor or radiation emitting atom, particle, molecule, or material, $E_1$, which may be a bright state, and the secondary excited state is the second excited state of an atom, particle, molecule, or material, $E_2$, may be a dark state. FIG. 1B illustrates the photon or radiation with an energy $E_{p1}$ exciting the atom, particle, molecule or material from the ground state with energy $E_g$ into the first excited state, which is a bright state. As illustrated in FIG. 1D, once the atom, particle, molecule, or material is in the first excited/bright state, thermal energy with energy $E_{12}$ may be provided to the atom, particle, molecule, or material to excite the atom, particle, molecule, or material into the second dark excited state, instead of the atom, particle, molecule, or material relaxing back to the ground state from the first excited state as shown in FIG. 1C. In embodiments that employ thermal energy to excite an atom, particle, molecule, or material from a first bright state to a second dark state, the emission time of the atom, particle, molecule, or material may be controlled and, more specifically, lengthened compared to the intrinsic relaxation time of the bright first excited state.

In other embodiments the primary and secondary excitation states may each be a dark state. The primary excitation state may be a dark state with a faster transition time than the dark state that is the secondary excitation state. Conversely, the primary excitation state may be a dark state with a slower transition time than the dark state that is the secondary excitation state. Similarly, in other embodiments the primary excitation state and secondary excitation state may each be a bright state. In embodiments with the primary and secondary excitation states being bright states, the primary excitation state may be a bright state with a transition time that is either faster or slower than the transition time of the bright state that is the secondary excitation state.

Further in reference again to FIGS. 1A-1D, in yet another alternative embodiment of a method, the primary excited state may be the first excited state of a phosphor or radiation emitting atom, particle, molecule, or material, $E_1$, which may be an excited state that emits a photon with a horizontal polarization during relaxation, and the secondary excited state may be the second excited state of an atom, particle, molecule, or material, $E_2$, which may be an excited state that emits a photon with a vertical polarization during relaxation. FIG. 1B illustrates the photon or radiation with an energy $E_{p1}$ exciting the atom, particle, molecule or material from the ground state with energy $E_g$ into the first excited state, which emits a horizontally polarized photon. FIG. 1C shows the de-excitation or relaxation of the atom, particle, molecule, or material from the first excited state to the ground state emitting a horizontally polarized photon with energy $E_{p1}$. Alternative, instead of allowing the atom, particle, molecule, or material to relax from the first excited state to the ground state, FIG. 1D illustrates a scenario where thermal energy with energy $E_{12}$ is provided to the atom, particle, molecule, or material exciting the atom, particle, molecule, or material from the first excited state into the second excited state. The atom, particle, molecule, or material may de-excite or relax from the second excited state to the ground state emitting a vertically polarized photon with energy $E_{p2}$. Therefore, the polarization of an emitted photon or emitted radiation may be controlled in embodiments with first and second excited states that emit photons with different polarizations.

In the embodiments described, the phosphor or radiation emitting atom, particle, molecule, or material is described as having only three quantum states: a ground state, a primary excited state, and a secondary excited state. In many embodiments described herein the primary excited state is a first excited energy state with energy $E_1$, and the secondary excited state is a second excited energy state with energy $E_2$ that is greater than $E_1$. In other embodiments the atom, particle, molecule, or material may have three, four, five, or more quantum states including but not limited to orbital angular momentum states, spin states, fine structure states, Zeeman split states, Stark shifted states, Stark split states, degenerate states, or any other quantum state or energy state. In embodiments with only two excited energy states, it is to be understood that the term first excited state refers the lower of the two excited energy states. In embodiments with more than two excited states it should be understood that the numerical labeling (i.e., first, second, third, etc.) denotes the relative energy levels of the excited states from the first excited state having a lowest excited energy level, to the second excited state having the next lowest excited energy level, to the third excited state having the third lowest excited energy level, and so on sequentially for each subsequent energy level. In any embodiment, the primary excited energy state may be any of the excited energy states of the system, and the secondary excited energy state may be any other of the excited energy states of the system. In addition, in embodiments that enable the control of emitted photon polarization, the photon polarizations may be horizontal, vertical, diagonal, linear, right- or left-circular, elliptical, or any other polarization.

The temperature of the phosphor or radiation emitting atom, particle, molecule, or material could be controlled through electronic means providing thermal energy or heat to the atom, particle, molecule, or material. Typically, electronic temperature control may cause multiple excitations enabling undesirable multi-photon emissions. Multiple excitations may also lead to non-radiative recombination, such as Auger recombination, and typically dissipates heat resulting in a potentially undesirable increase in the temperature of a material or system. Therefore, it is desirable to provide thermal energy to the atom, particle, molecule, or material without electronic excitation.

FIG. 2A illustrates an embodiment of an optical emitter 200 with a radiation emitting material 202 and a thermal contribution material 212 that provides thermal energy to the radiation emitting material 202 without electronic excitation. The optical emitter 200 of FIG. 2A may implement the methods illustrated by FIGS. 1A-1D and described herein. Therefore, the following description of the optical emitter 200 will refer to both FIG. 2A and FIGS. 1A-1D simultaneously. In an embodiment, the radiation emitting material 202 of the optical emitter 200 in FIG. 2A may be a semiconductor nanoparticle and the thermal contribution material 212 may be a ligand bound to the semiconductor nanoparticle. A primary radiation source 204 may provide primary radiation 206 to the nanoparticle to excite the nanoparticle from a ground state, $E_g$, to the primary excited state that is a first excitation energy state, $E_1$, as illustrated in FIG. 1B. A secondary radiation source 208 may provide secondary radiation 210 to the thermal contribution material 212 (e.g., the ligand) to cause the generation of thermal energy in the material 212. To reach thermal equilibrium, the induced thermal energy or heat in the material 212 may flow to the radiation emitting material 202, promoting the radiation emitting material 202 from the first excitation energy state, $E_1$, into the secondary excited state that is a second excitation energy state, $E_2$, as illustrated in FIG. 1D. The radiation emitting material 202 may de-excite or relax from the second energy state, $E_2$, back to the ground state, $E_g$, by emitting a photon with energy $E_{p2}$. The optical emitter 200 of FIG. 2A enables dynamic control of photon emissions, and prevents electronically induced multi-photon emission by utilizing an intermediary ligand as the thermal contribution material 212 to the semiconductor nanoparticle that is the radiation emitting material 202.

While the radiation emitting material 202 in the embodiment of the optical emitter 200 of FIG. 2A is described as a semiconductor nanoparticle, the radiation emitting material 202 may alternatively be a quantum dot, a non-semiconductor nanoparticle, a nanocrystal, a bulk material, a monolayer or 2D material, a nanorod, a nanowire, any other nanostructure, or any other material able to emit radiation. Additionally, the radiation emitting material 202 of FIG. 2A may be cadmium selenide, a halide perovskite, a rare earth material, a III-V semiconductor material, a II-VI semiconductor material, an inorganic material, a molecular singlet, a molecular triplet, or any other atom, molecule, or assembly with a spin-forbidden or other forbidden transition state.

The thermal contribution material 212 of FIG. 2A may be a ligand. A ligand is not to be understood as an ion or molecule to be attached or bound to a metal atom, but rather as a molecule that binds to another metal or non-metal atom, particle, molecule, or material. While the thermal contribution material 212 of FIG. 2A is represented by generic bold lines, the thermal contribution material 212 may be a coating on a molecule or nanoparticle, a molecular antenna structure, or any other ligand or material able to bond with, and provide thermal energy to, the radiation emitting material 202.

The primary and secondary radiation sources 204 and 208 may each be a laser, a light emitting diode, a single-photon source, a black-body radiation source, a visible radiation source, an infrared radiation source, or any other source or combination of sources able to provide the desired radiation to the radiation emitting material 202 and the thermal contribution material 212. Accordingly, the primary and secondary radiations 206 and 210 may each be ultraviolet radiation, visible radiation, infrared radiation, microwave radiation, or any other radiation or combination of radiations with wavelengths or frequencies able to excite the radiation emitting material 202, and generate or induce thermal energy in the thermal contribution material 212 as desired. The primary and secondary radiations 206 and 210 may also each be continuous radiation, pulsed radiation with a constant duty cycle, pulsed radiation with a duty cycle that increases or decreases over time, pulsed radiation with a pulse repetition frequency that increases or decreases over time, pulse radiation with a radiation frequency that increases or decreases over time, pulsed radiation with an arbitrary pulse pattern, pulsed radiation with a predetermined pulse pattern, pulsed radiation with a probabilistic pulse pattern or sequence, or any other pulsed radiation pattern.

Figure 2B:
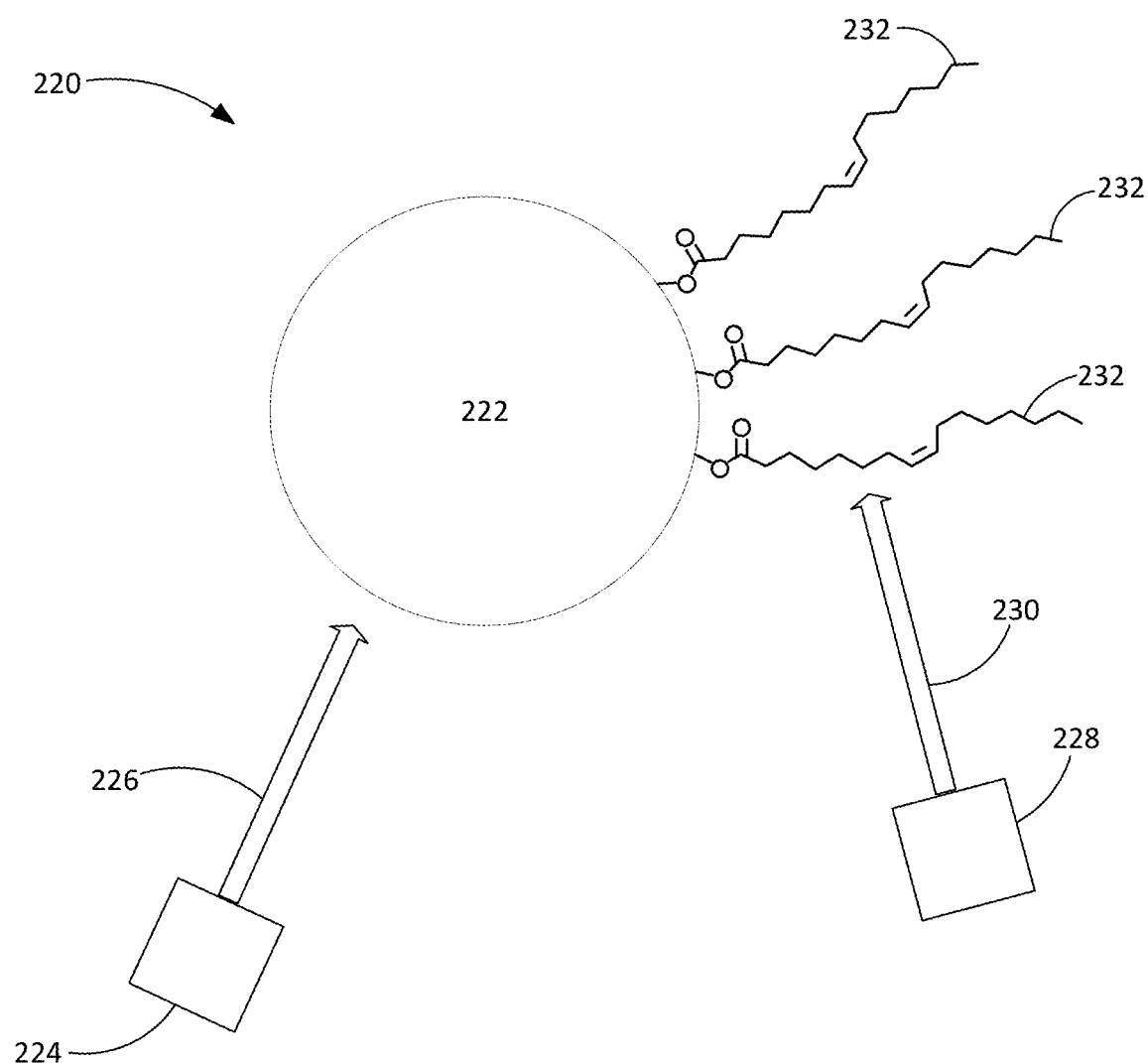
FIG. 2B illustrates an embodiment of an optical emitter having cadmium selenide as a radiation emitting material, a plurality of hydrocarbon surface ligands as a thermal contribution material, primary and secondary radiations, and primary and secondary radiation sources.

FIG. 2B illustrates a particular embodiment of an optical emitter 220 with a cadmium selenide nanocrystal 222 made of multiple cadmium selenide molecules, as the radiation emitting material 202. In the optical emitter 220, a plurality of hydrocarbon surface ligands 232 acts as the thermal contribution material 212. In this embodiment, a primary radiation source 224 may provide primary radiation 226 in the visible or ultraviolet range to excite the cadmium selenide in the nanocrystal 222 into the lowest, first excited energy state of cadmium selenide. The bandgap of cadmium selenide is 1.74 eV, so radiation with an energy of 1.74 eV or greater is required to excite the cadmium selenide in the cadmium selenide nanocrystal 222 from the ground state into the first excited state. In embodiments, it is desirable for the primary radiation 226 to have an energy greater than the bandgap energy of the radiation emitting material 202 to induce extra thermal energy in the radiation emitting material allowing for initial excitations into the higher energy, second excited state. In cadmium selenide, the second excited state is a faster transition state than the first excited, lower energy state. Therefore, applying primary radiation 226 that is able to promote at least some of the cadmium selenide in the nanocrystal 222 into the second, faster transition energy state results in an initial radiation emission followed later by the radiation emission from any cadmium selenide excited into the first, slower transition energy state. A second radiation source 228 may provide secondary radiation 230 to the plurality of hydrocarbon surface ligands 232 coating the cadmium selenide nanocrystal 222. The secondary radiation 230 may be in the mid-infrared range which has energies insufficient for exciting cadmium selenide from the ground state into the first excited state. It is also desirable for the secondary radiation 230 to have frequencies that are resonant with the vibrations of the plurality of hydrocarbon surface ligands 232. The C—H bonds in the plurality of hydrocarbon surface ligands 232 have vibrational resonances in the 3400 to 3600 nm range. Therefore, utilizing infrared radiation as the secondary radiation 230 does not create any new excitations, but may perturb already existing excitations. The secondary radiation 230 may induce thermal energy in the plurality of hydrocarbon surface ligands 232, which is transferred or flows from the plurality of hydrocarbon surface ligands 232 to the cadmium selenide nanocrystal 222. The thermal energy may excite any excited cadmium selenide in the cadmium selenide nanocrystal 222 from the first excitation state into the second, faster transition excitation state resulting in further radiation emission, and enabling dynamic control of emission from the cadmium selenide nanocrystal 222. As one will understand in view of this specification, the secondary radiation 210 may be applied to the thermal contribution material 212, of FIG. 2A, at a time before applying the primary radiation 206 to the radiation emitting material 202 due to the fact that it takes time for the thermal energy to propagate from the thermal contribution material 212 to the radiation emitting material 202. The timing of applying the primary and secondary radiations 206 and 210 may be determine by the thermal properties of the thermal contribution material 212 and the radiation emitting material 202.

While a plurality of hydrocarbon surface ligands 232 in the optical emitter 220 of FIG. 2B have a 15 carbon backbone, the thermal contribution material may be any number of other types of ligands. For example, the thermal contribution material 212 of FIG. 2A may be a $C_{1-50}$alkylene. The backbone of the $C_{1-50}$alkylene may contain one or more heteroatoms selected from O, NH, and/or S. The thermal contribution material 212 of FIG. 2A may also be any other ligand, structure, or material able to generate thermal energy and transfer the generated heat or thermal energy to the radiation emitting material 202.

Figure 2C:
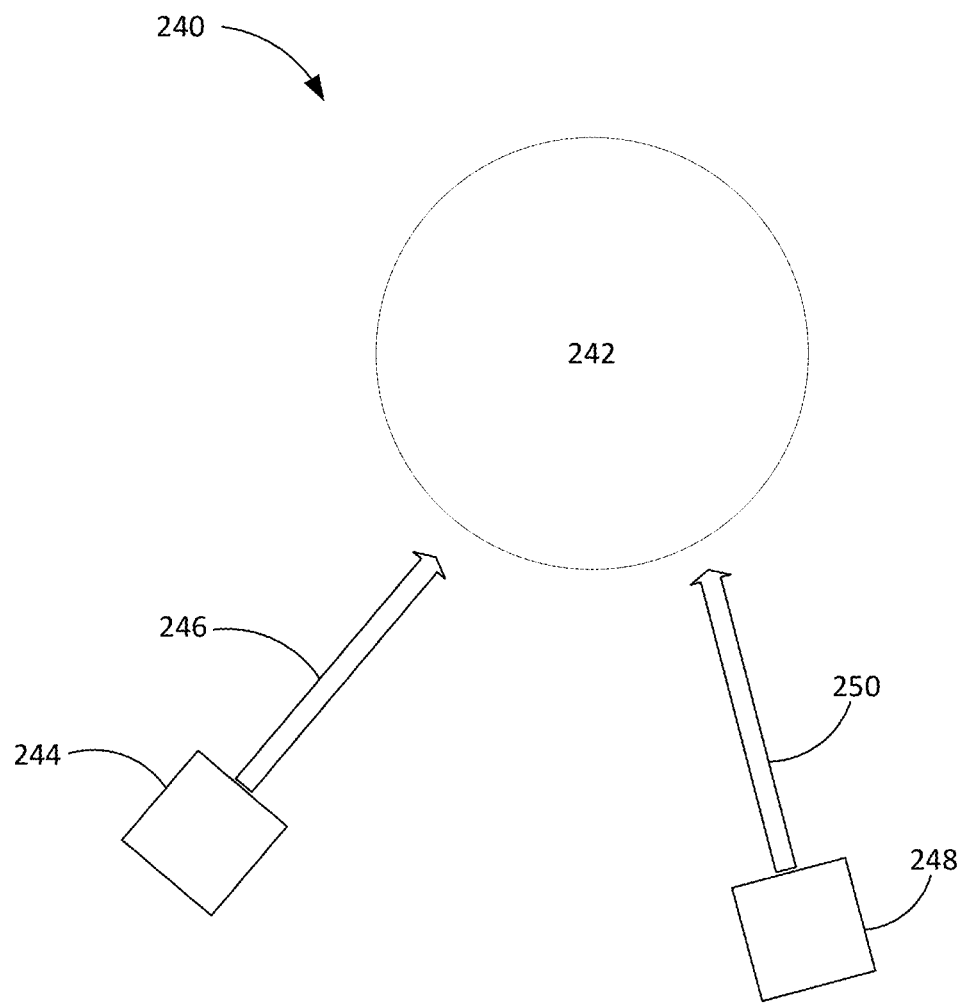
FIG. 2C illustrates an embodiment of an optical emitter having lead halide perovskite as both a radiation emitting material and a thermal contribution material, primary and secondary radiations, and primary and secondary radiation sources.

FIG. 2C illustrates an embodiment of an optical emitter 240 that employs lead halide perovskite 242 as the radiation emitting material 202. The lead halide perovskite 242 has an energy band structure with the lowest, first excited energy state being a first faster transition excited state, and a second excitation state, with energy greater than the first faster excitation state, being a slower transition excitation state. Therefore, the lead halide perovskite 242 has the opposite relative excitation state decay speeds of the embodiment implementing cadmium selenide as the radiation emitting material 202. Due to the vibration resonances of lead halide perovskite 242, the lead halide perovskite 242 may act as both the radiation emitting material 202 and the thermal contribution material 212 of the optical emitter 240, removing the need for a second material, coating, or antenna to act as the thermal contribution material 212. It is therefore possible to slow the emission of photons from the lead halide perovskite 242 using a primary and secondary radiation source 244 and 248. A primary radiation source 244 may provide primary radiation 246 to the lead halide perovskite 242 to excite at least some of the lead halide perovskite 242 from the ground energy state to the first, fast transition excited energy state. The second radiation source 248 may provide secondary radiation 250 to the lead halide perovskite 242 to generate thermal energy in the lead halide perovskite 242 and further excite any excited lead halide perovskite 242 from the first excited energy state to the second, slower transition excited energy state.

FIGS. 3A-3H are a series of plots presenting emission time vs. emitted photon wavelength for cadmium selenide nanoparticles (e.g., as shown in FIG. 2B) or nanocrystals of various sizes. The top row, FIGS. 3A-3D present emission data after visible band, 400 nm, primary radiation is applied to the cadmium selenide nanocrystals at time t=0. The cadmium selenide excited into the second or faster transition excited energy state emits an initial band of photons observed in FIGS. 1A-1D near the time that the primary radiation is applied, at t=0, followed by an exponential decay of subsequent slower emissions. The bottom row, FIGS. 3E-3H present emission data from cadmium selenide with the application of both a primary radiation with a wavelength of 400 nm, and a secondary radiation with a wavelength of 3460 nm applied 500 picoseconds after the primary radiation. The application of the secondary radiation promotes some of the cadmium selenide from the first slower transition excitation energy level into the second faster transition excitation energy level thereby inducing faster radiation emission as evidenced by the second bright emission band at t=500 ps in FIGS. 3E-3H. The various sizes of the cadmium selenide nanocrystals in FIGS. 3A-3H determine how much cadmium selenide is present and therefore how much primary radiation is absorbed and how many photons are emitted by the cadmium selenide nanocrystal. While the secondary radiation is applied at a time t=500 ps after the primary radiation is applied, the secondary radiation could be applied at 10, 24, 50, 100, 200, 300, 400, 600, 800, 1000 picoseconds after the primary radiation is applied, or any time that any cadmium selenide is in the first slower transition excited state.

Figure 4A:
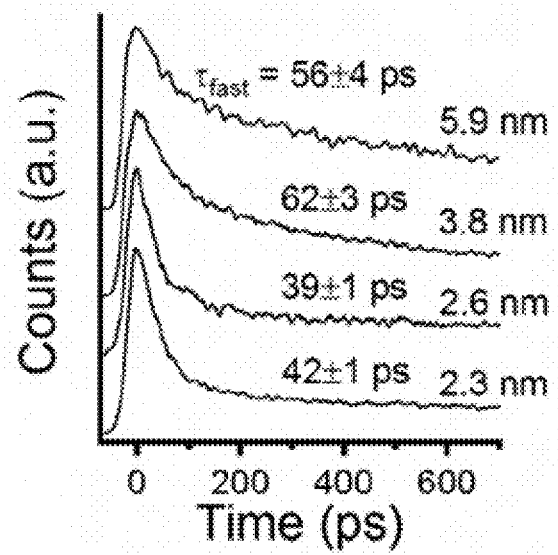
FIGS. 4A and 4B are plots showing the photon emission over time of a cadmium selenide nanoparticle due to an applied primary radiation with associated decay time constants.
Figure 4B:
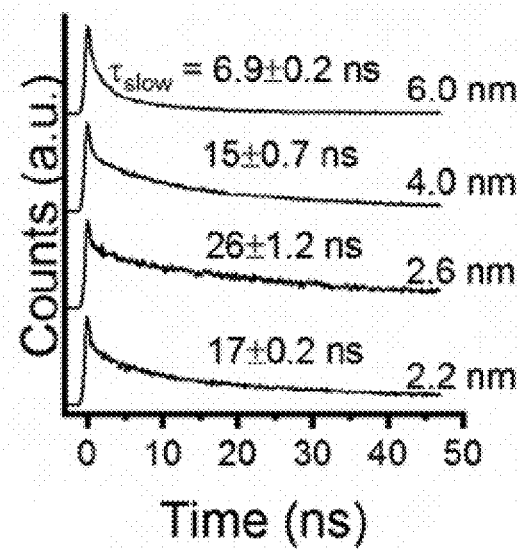

FIGS. 4A and 4B are plots showing the integrated time-resolved photon emission over time for various sizes of cadmium selenide nanoparticles at a temperature of 5 Kelvin with a primary radiation excitation of 400 nm. FIG. 4A shows the faster transition time constants for the four sizes of cadmium selenide nanoparticles with transition times on the order of tens of nanoseconds. The faster transition time constants reported in FIG. 4A are determined by a biexponential fit to the presented data and represent a statistical measure of how long a typical cadmium selenide molecule exists in the second, faster transition excitation state before relaxing into the ground state and emitting a photon. FIG. 4B presents the same data as FIG. 4A over an expanded time period. The slower transition time constants for four different sized cadmium selenide nanoparticles are presented in FIG. 4B with transition times on the order of nanoseconds. The slower transition time constant values presented in FIG. 4B are determined by a biexponential fit to the presented data and represent a statistical measure of how long a typical cadmium selenide molecule exists in the first, slower transition excitation state before relaxing to the ground state and emitting a photon. The data presented in FIGS. 4A and 4B show that the faster and slower transition excitation state time constants of cadmium selenide differ by over two orders of magnitude.

Figure 4C:
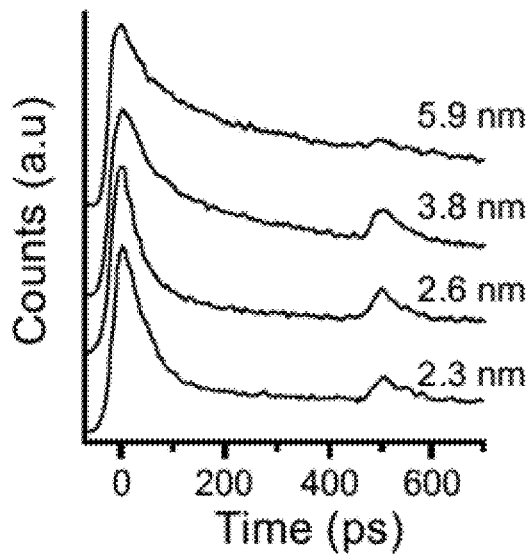
FIGS. 4C and 4D are plots showing the photon emission over time of a cadmium selenide nanoparticle due to an applied primary radiation and an applied secondary radiation with associated decay time constants.
Figure 4D:
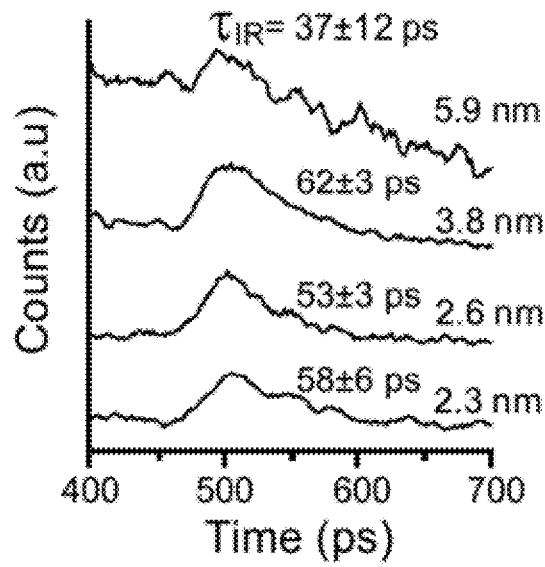

FIGS. 4C and 4D display plots showing the integrated time-resolved photon emission over time for various sizes of cadmium selenide nanoparticles at a temperature of 5 Kelvin with a primary radiation excitation of 400 nm, followed by a secondary radiation excitation with a wavelength of 3460 nm applied 500 ps after the primary radiation excitation. The curves shown in FIG. 4C have faster transition times determined by a biexponential fit that are very close to the faster transition times reported in FIG. 4A, with transition times on the order of tens of picoseconds. In FIG. 4C there is a feature at t=500 ps that is not present in the data shown in FIG. 4A. An increase in photon emission is observed at t=500 ps which is at the time that the secondary radiation is applied to the cadmium selenide nanoparticles. FIG. 4D is a close up or zoom in on the increased emission feature at t=500 ps which exhibits a transition time or lifetime constant on the order of tens of picoseconds, which is the same magnitude as the lifetime constant of the second faster transition excitation state. The faster transition feature exhibited in FIGS. 4C and 4D, that is not present in FIGS. 4A and 4B, can be concluded to be the result of thermal energy transferring into the cadmium selenide and promoting cadmium selenide molecules from a first slower transition excited state into a second faster transition excited state due to the fact that the secondary radiation at 3460 nm does not provide sufficient energy to excite cadmium selenide from the ground state into any excited states.

Figure 5:
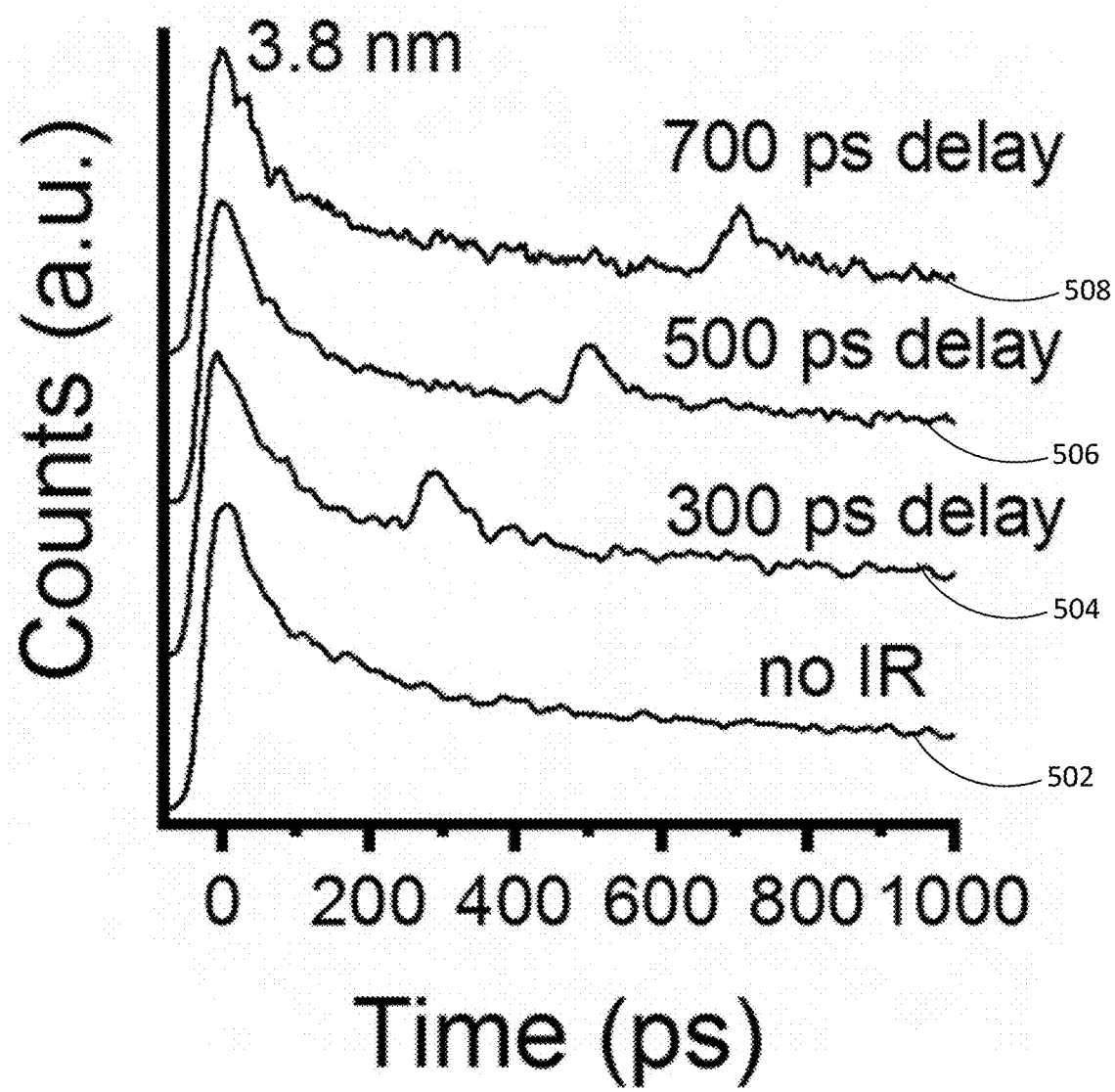
FIG. 5 is a plot showing photon emission over time from a cadmium selenide nanoparticle with an applied primary radiation, and various secondary radiations applied at various times subsequent to the applied primary radiation.

FIG. 5 is a plot of emission data demonstrating the temporal control, and potential temporal resolution of photon emission control enabled by the embodiments herein. Emitted photon counts are reported in arbitrary units (a.u.) and the time dimension is reported in picoseconds. The lowest curve 502 on the plot of FIG. 5 shows photon emissions from a 3.8 nm cadmium selenide nanoparticle with a primary radiation applied at time t=0 ps and no subsequent applied radiation. The three other curves 504, 506, and 508, present in FIG. 5 show the photon emissions from a 3.8 nm cadmium selenide nanoparticle with a primary radiation applied at time t=0, and subsequent secondary radiations applied at times t=300, 500, and 700 ps. The three curves 504, 506, and 508 with both an applied primary and secondary radiation exhibit two emission features corresponding in time with the applied primary and secondary radiations, while the curve 502 with no applied secondary radiation only exhibits the initial first emission feature at time t=0. The timing precision of the second emission features in the curves 504, 506, and 508 of FIG. 5 can be on the order of femtoseconds which is determined by the timing and shaping of the secondary radiation pulse. While the temporal control or resolution demonstrated by the curves in FIG. 5 is on the scale of 100 ps the temporal control is limited, in theory, by the decay time constant of the faster excited state, which for cadmium selenide is on the order of tens of picoseconds. Another property which may contribute to the timing precision and resolution of the secondary emission from a material is the time required for thermal energy to transfer from a thermal contribution material to a phosphor, which varies for different materials.

Figure 6:
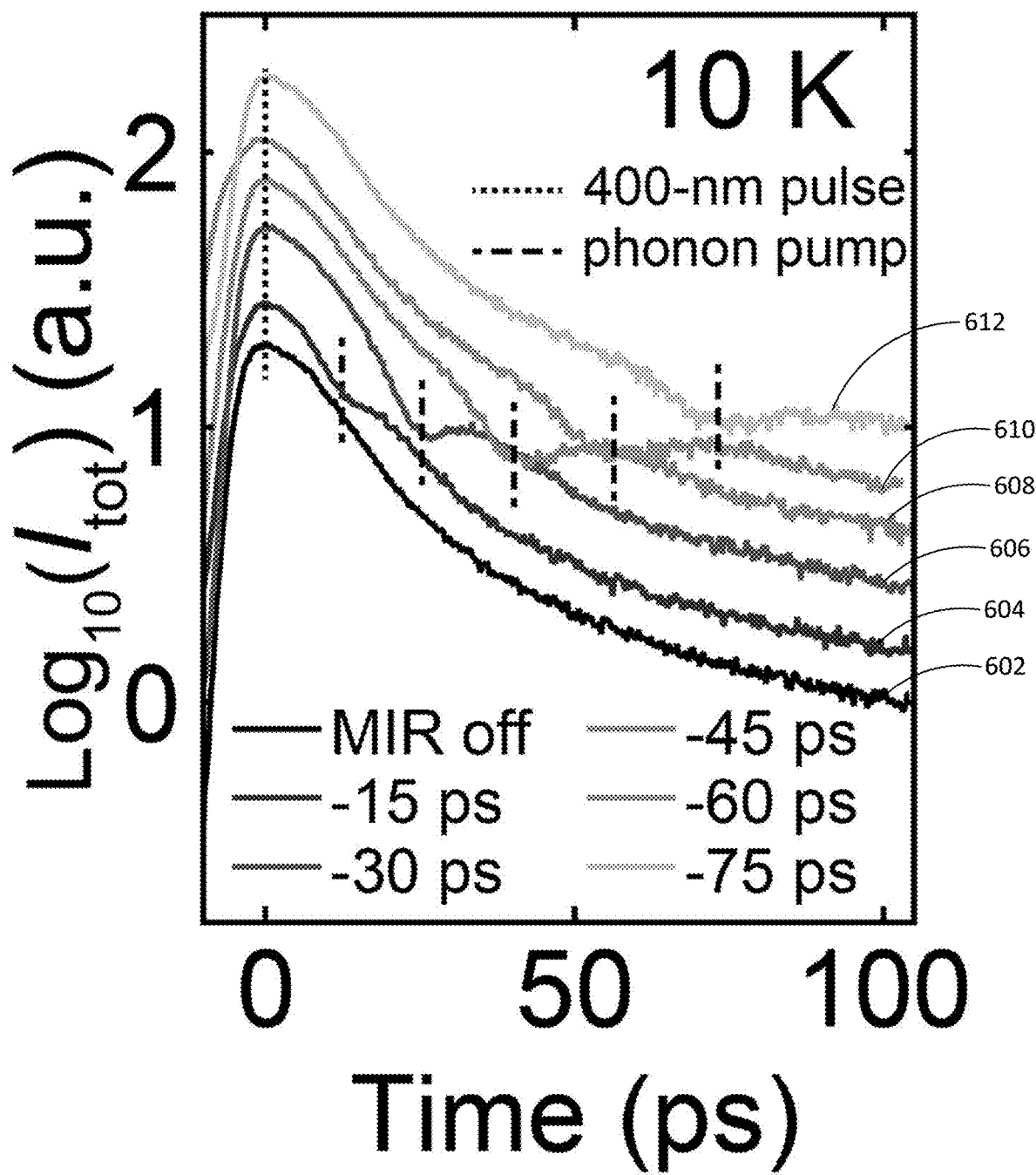
FIG. 6 is a plot showing photon emission over time from a lead halide perovskite crystal with an applied primary radiation, and various secondary radiations applied at various times subsequent to the applied primary radiation.

FIG. 6 presents a plot with a curve 602 showing photon emission in arbitrary units over time from a single crystal of lead halide perovskite (e.g., as shown in FIG. 2C) with a primary radiation with a wavelength of 400 nm applied at time t=0 ps, with no subsequent applied secondary radiation. The other five curves 604, 606, 608, 610, and 612 in the plot of FIG. 6 show photon emission over time for a single crystal of lead halide perovskite with a primary radiation excitation with a wavelength of 400 nm applied at time t=0 ps, followed by a secondary radiation excitation with a wavelength of 3200 nm applied to the halide perovskite at various times subsequent to the applied primary radiation. A vertical dotted line at time t=0 ps through all of the curves shows the initial emission peak from the lead halide perovskite due to the applied primary radiation exciting the lead halide perovskite into the first faster transition state. A second vertical dotted line is present on each of the top five curves 604, 606, 608, 610, and 612 showing the various times at which the secondary radiation was applied. At the second vertical lines, there exists a second emission feature on each of the curves 604, 606, 608, 610, and 612 with a brief rapid decrease in emission resulting in an emission trough. The emission trough present in the curves 604, 606, 608, 610, and 612 of FIG. 6 coincides temporally with the application of the secondary radiation, suggesting that the secondary radiation has excited some of the lead halide perovskite from the first faster transition excited state into the second slower transition excited state causing a brief period of time where less emission occurs.

The embodiments of dynamically controllable optical emitters presented herein may be implemented in photon sources to control optical emissions with picosecond time-scale resolution. The embodiments described herein also allow for the control of the temperature of an optical emitting device without electronic excitation, which helps reduce the amount of multi-photon emissions and can reduce non-radiative recombinations such as Auger recombinations. The secondary radiation or thermal excitation radiation can be tuned in power, time, and/or energy to enhance deterministic photon emissions of the optical emitter. In addition, the methods and embodiments of optical emitters described herein may be used to program probabilistic pulse sequences that are more complex than the exponential decay that naturally occurs in many single photon sources. Current single photon source technologies can operate at 300 MHz, or one photon emission every 3 ns, which is 10 to 50 times slower than the demonstrated capabilities of the methods and embodiments of optical emitters described herein.

The following list of aspects reflects a variety of the embodiments explicitly contemplated by the present application. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method for controlling optical emissions of a material, the method comprising: selecting a radiation emitting material, the radiation emitting material having a primary excitation state and a secondary excitation state, wherein the primary and secondary excitation states have different decay rates; applying a primary radiation to the radiation emitting material to excite the radiation emitting material to the primary excitation state; and applying a secondary radiation to a thermal contribution material physically coupled to the radiation emitting material causing the generation of thermal energy in the thermal contribution material, and the thermal contribution material being physically configured for thermal energy to flow from the thermal contribution material to the radiation emitting material to promote the excited radiation emitting material to the secondary excitation state.

2. The method of aspect 1, wherein the primary excitation state of the selected radiation emitting material is a dark excitation state, and wherein the secondary excitation state of the selected radiation emitting material is a bright excitation state.

3. The method of aspect 1, wherein the primary excitation state of the selected radiation emitting material is a bright excitation state, and wherein the secondary excitation state of the selected radiation emitting material is a dark excitation state.

4. The method of aspect 1, wherein the primary excitation state of the selected radiation emitting material is a slower transition excitation state, and wherein the secondary excitation state of the selected radiation emitting material is a faster transition excitation state.

5. The method of aspect 1, wherein the primary excitation state of the selected radiation emitting material is a faster transition excitation state, and wherein the secondary excitation state is a slower transition excitation state.

6. The method of aspect 1, wherein the primary excitation state of the selected radiation emitting material emits a photon with a horizontal polarization, and wherein the secondary excitation state of the selected radiation emitting material emits a photon with a vertical polarization.

7. The method of any one of aspects 1 to 6, wherein applying the primary radiation to the radiation emitting material comprises applying ultraviolet radiation to the radiation emitting material.

8. The method any one of aspects 1 to 6, wherein applying the primary radiation to the radiation emitting material comprises applying visible radiation to the radiation emitting material.

9. The method of any one of aspects 1 to 8, wherein applying the secondary radiation to the thermal contribution material comprises applying a single pulse of radiation to the thermal contribution material.

10. The method of any one of aspects 1 to 8, wherein applying the secondary radiation to the thermal contribution material comprises applying a series of pulses of radiation, with a constant duty cycle, to the thermal contribution material.

11. The method of any one of aspects 1 to 8, wherein applying the secondary radiation to the thermal contribution material comprises applying a series of pulses of radiation, with a pulse repetition frequency that increases or decreases over time, to the thermal contribution material.

12. The method of any one of aspects 1 to 8, wherein applying the secondary radiation to the thermal contribution material comprises applying a series of pulses of radiation, with an arbitrary pulse pattern, to the thermal contribution material.

13. The method of any one of aspects 1 to 12, wherein applying the secondary radiation to the thermal contribution material comprises applying infrared radiation to the radiation emitting material.

14. The method of any one of aspects 1 to 13, wherein the radiation emitting material comprises a phosphor.

15. The method of any one of aspects 1 to 14, wherein the radiation emitting material comprises a molecular singlet.

16. The method of any one of aspects 1 to 14, wherein the radiation emitting material comprises a molecular triplet.

17. The method of any one of aspects 1 to 16, wherein the radiation emitting material comprises a III-V semiconductor material.

18. The method of any one of aspects 1 to 16, wherein the radiation emitting material comprises a II-VI semiconductor material.

19. The method of any one of aspects 1 to 18, wherein the radiation emitting material comprises a material with a spin-forbidden transition state.

20. The method of any one of aspects 1 to 19, wherein the radiation emitting material comprises a quantum dot.

21. The method of any one of aspects 1 to 19, wherein the radiation emitting material comprises a nanocrystal.

22. The method of any one of aspects 1 to 19, wherein the radiation emitting material comprises a bulk material.

23. The method of any one of aspects 1 to 22, wherein the thermal contribution material comprises a ligand.

24. The method of any one of aspects 1 to 23, wherein the thermal contribution material comprises an organic material.

25. The method of any one of aspects 1 to 24, wherein the thermal contribution material comprises the same material as the radiation emitting material.

26. The method of any one of aspects 1 to 25, wherein the thermal contribution material comprises a plurality of hydrocarbon surface ligands.

27. The method of any one of aspects 1 to 26, wherein the thermal contribution material comprises a C1-50alkylene, wherein the carbon backbone optionally has one or more heteroatoms selected from O, NH, and S.

28. An optical device comprising: a radiation emitting material having a primary excitation state and a secondary excitation state, wherein the primary and secondary excitation states have different decay rates; a thermal contribution material physically coupled to the radiation emitting material and configured to provide thermal energy to the radiation emitting material; a primary radiation source configured to supply primary radiation to the radiation emitting material to excite the radiation emitting material to the primary excitation state; and a secondary radiation source configured to provide secondary radiation to the thermal contribution material to generate thermal energy in the thermal contribution material.

29. The optical device of aspect 28, wherein the primary excitation state of the radiation emitting material is a dark excitation state, and wherein the secondary excitation state of the radiation emitting material is a bright excitation state.

30. The optical device of aspect 28, wherein the primary excitation state of the radiation emitting material is a bright excitation state, and wherein the secondary excitation state of the radiation emitting material is a dark excitation state.

31. The optical device of aspect 28, wherein the primary excitation state of the radiation emitting material is a slower transition excitation state, and the secondary excitation state of the radiation emitting material is a faster transition excitation state compared.

32. The optical device of aspect 28, wherein the primary excitation state of the radiation emitting material is a faster transition excitation state, and the secondary excitation state of the radiation emitting material is a slower transition excitation state.

33. The optical device of aspect 28, wherein the primary excitation state of the radiation emitting material emits a photon with a horizontal polarization, and wherein the secondary excitation state of the radiation emitting material emits a photon with a vertical polarization.

34. The optical device of any one of aspects 28 to 33, wherein the primary radiation source is configured to emit ultraviolet radiation.

35. The optical device of any one of aspects 28 to 33, wherein the primary radiation source is configured to emit visible radiation.

36. The optical device of any one of aspects 28 to 35, wherein the secondary radiation source is configured to emit a single pulse.

37. The optical device of any one of aspects 28 to 35, wherein the secondary radiation source is configured to emit a series of pulses with a constant duty cycle.

38. The optical device of any one of aspects 28 to 35, wherein the secondary radiation source is configured to emit a series of pulses with a pulse repetition frequency that increases or decreases over time.

39. The optical device of any one of aspects 28 to 35, wherein the secondary radiation source is configured to emit a series of pulses with an arbitrary pulse pattern.

40. The optical device of any one of aspects 28 to 39, wherein the secondary radiation source is configured to emit infrared radiation.

41. The optical device of any one of aspects 28 to 40, wherein the radiation emitting material comprises a phosphor.

42. The optical device of any one of aspects 28 to 41, wherein the radiation emitting material comprises a molecular singlet.

43. The optical device of any one of aspects 28 to 41, wherein the radiation emitting material comprises a molecular triplet.

44. The optical device of any one of aspects 28 to 43, wherein the radiation emitting material comprises a III-V semiconductor material.

45. The optical device of any one of aspects 28 to 43, wherein the radiation emitting material comprises a II-VI semiconductor material.

46. The optical device of any one of aspects 28 to 45, wherein the radiation emitting material comprises a material with a spin-forbidden transition state.

47. The optical device of any one of aspects 28 to 46, wherein the radiation emitting material comprises a quantum dot.

48. The optical device of any one of aspects 28 to 46, wherein the radiation emitting material comprises a nanocrystal.

49. The optical device of any one of aspects 28 to 46, wherein the radiation emitting material comprises a bulk material.

50. The optical device of any one of aspects 28 to 49, wherein the thermal contribution material comprises a ligand.

51. The optical device of any one of aspects 28 to 50, wherein the thermal contribution material comprises an organic material.

52. The optical device of any one of aspects 28 to 50, wherein the thermal contribution material comprises the same material as the radiation emitting material.

53. The optical device of any one of aspects 28 to 52, wherein the thermal contribution material comprises a plurality of hydrocarbon surface ligands.

54. The optical device of any one of aspects 28 to 53, wherein the thermal contribution material comprises a C1-50alkylene, wherein the carbon backbone optionally has one or more heteroatoms selected from O, NH, and S.

The invention claimed is:

1. A method for controlling optical emissions of a material, the method comprising:
   selecting a radiation emitting material, the radiation emitting material having a primary excitation state and a secondary excitation state, wherein the primary and secondary excitation states have different decay rates;
   applying a primary radiation to the radiation emitting material to excite the radiation emitting material to the primary excitation state; and
   applying a secondary radiation to a thermal contribution material physically coupled to the radiation emitting material causing the generation of thermal energy in the thermal contribution material, and the thermal contribution material being physically configured for thermal energy to flow from the thermal contribution material to the radiation emitting material to promote the excited radiation emitting material to the secondary excitation state.

2. The method of claim 1, wherein the primary excitation state of the selected radiation emitting material is a dark excitation state, and wherein the secondary excitation state of the selected radiation emitting material is a bright excitation state.

3. The method of claim 1, wherein the primary excitation state of the selected radiation emitting material is a bright excitation state, and wherein the secondary excitation state of the selected radiation emitting material is a dark excitation state.

4. The method of claim 1, wherein the primary excitation state of the selected radiation emitting material is a slower transition excitation state, and wherein the secondary excitation state of the selected radiation emitting material is a faster transition excitation state.

5. The method of claim 1, wherein the primary excitation state of the selected radiation emitting material is a faster transition excitation state, and wherein the secondary excitation state is a slower transition excitation state.

6. The method of claim 1, wherein the primary excitation state of the selected radiation emitting material emits a photon with a horizontal polarization, and wherein the secondary excitation state of the selected radiation emitting material emits a photon with a vertical polarization.

7. The method of claim 1, wherein the thermal contribution material comprises a ligand.

8. The method of claim 1, wherein the thermal contribution material comprises an organic material.

9. The method of claim 1, wherein the thermal contribution material comprises the same material as the radiation emitting material.

10. The method of claim 1, wherein the thermal contribution material comprises a plurality of hydrocarbon surface ligands.

11. An optical device comprising:
   a radiation emitting material having a primary excitation state and a secondary excitation state, wherein the primary and secondary excitation states have different decay rates;
   a thermal contribution material physically coupled to the radiation emitting material and configured to provide thermal energy to the radiation emitting material;
   a primary radiation source configured to supply primary radiation to the radiation emitting material to excite the radiation emitting material to the primary excitation state; and
   a secondary radiation source configured to provide secondary radiation to the thermal contribution material to generate thermal energy in the thermal contribution material.

12. The optical device of claim 11, wherein the primary radiation source is configured to emit ultraviolet radiation.

13. The optical device of claim 11, wherein the primary radiation source is configured to emit visible radiation.

14. The optical device of claim 11, wherein the primary radiation source is configured to emit infrared radiation.

15. The optical device of claim 11, wherein the radiation emitting material comprises a phosphor.

16. The optical device of claim 11, wherein the radiation emitting material comprises a III-V semiconductor material.

17. The optical device of claim 11, wherein the radiation emitting material comprises a II-VI semiconductor material.

18. The optical device of claim 11, wherein the radiation emitting material comprises a material with a spin-forbidden transition state.

19. The optical device of claim 11, wherein the radiation emitting material comprises a quantum dot.

20. The optical device of claim 11, wherein the radiation emitting material comprises a bulk material.

* * * * *